US007415077B2

United States Patent
Kroebel et al.

(10) Patent No.: US 7,415,077 B2
(45) Date of Patent: Aug. 19, 2008

(54) TRANSMISSION ARRANGEMENT, PARTICULARLY FOR MOBILE RADIO

(75) Inventors: Hans-Eberhard Kroebel, München (DE); Martin Simon, Otterfing (DE)

(73) Assignee: Infineon Technologies AG, Munich (DE)

( * ) Notice: Subject to any disclaimer, the term of this patent is extended or adjusted under 35 U.S.C. 154(b) by 556 days.

(21) Appl. No.: 11/046,510

(22) Filed: Jan. 28, 2005

(65) Prior Publication Data

US 2005/0190856 A1    Sep. 1, 2005

Related U.S. Application Data

(63) Continuation of application No. PCT/DE03/02477, filed on Jul. 23, 2003.

(30) Foreign Application Priority Data

Jul. 29, 2002    (DE) ................... 102 34 657

(51) Int. Cl.
*H04L 27/00*    (2006.01)

(52) U.S. Cl. ............... 375/295; 375/296; 455/127.1

(58) Field of Classification Search .......... 375/295, 375/300; 455/126, 127.1; 327/53, 66, 132
See application file for complete search history.

(56) References Cited

U.S. PATENT DOCUMENTS

| 3,384,840 | A | 5/1968 | Holsinger |
| 3,577,009 | A | 5/1971 | Hofmeister |
| 4,243,955 | A | 1/1981 | Daniel et al. |
| 5,107,487 | A | 4/1992 | Vilmur et al. |
| 5,381,108 | A | 1/1995 | Whitmarsh et al. |
| 5,396,196 | A | 3/1995 | Blodgett |
| 5,574,994 | A | 11/1996 | Huang et al. |
| 5,841,322 | A | 11/1998 | Ivanov et al. |

(Continued)

FOREIGN PATENT DOCUMENTS

EP    0 265 218 B1    4/1988

(Continued)

OTHER PUBLICATIONS

"An Adaptive Digital Technique for Compensating for Analog Quadrature Modulator/ Demodulator Impairments" Anit Lohtia, Paul A. Goud and Colin G. Englefield, IEEE Pac Rim '93, 1993, pp. 447-450.

(Continued)

*Primary Examiner*—David C. Payne
*Assistant Examiner*—Rahel Guarino
(74) *Attorney, Agent, or Firm*—Eschweiler & Associates, LLC

(57) ABSTRACT

The invention specifies a transmission arrangement, particularly for mobile radio, which has a homodyne design and in which a feedback path is routed from the input or from the output of the vector modulator (10, 11, 12, 14) via a switch (20) and an A/D converter (19) back to the digital signal processing (3) in baseband (1). As a result, it is a particularly simple matter to detect offsets and amplitude mismatches and to correct them without difficulty in a digital signal processor (3). This allows both significantly improved carrier frequency suppression and significantly improved sideband suppression to be achieved with little complexity. The mobile radio transmitter described is particularly suitable for use in modern mobile radio systems such as GSM EDGE and UMTS.

6 Claims, 3 Drawing Sheets

U.S. PATENT DOCUMENTS

| | | | |
|---|---|---|---|
| 6,373,345 B1 * | 4/2002 | Kimppa et al. | 332/105 |
| 7,106,806 B1 * | 9/2006 | Kenington | 375/297 |
| 2001/0051504 A1 | 12/2001 | Kubo et al. | |
| 2002/0031191 A1 * | 3/2002 | Shimizu | 375/295 |

FOREIGN PATENT DOCUMENTS

| | | |
|---|---|---|
| EP | 0 477 720 B1 | 4/1992 |

OTHER PUBLICATIONS

"A Gain/Phase Imbalance Minimization Technique for Linc Transmitter", Xuejun Zheng, Peter Nanawa, Lawrence E. Larson and Peter M. Asbeck, IEEE MTT-S International Microwave Symposium Diges, 2001, pp. 801-804.

International Search Report, Int'l Application No. PCT/DE03/02477, Int'l Filing date Jul. 23, 2003, 3 pgs.

* cited by examiner

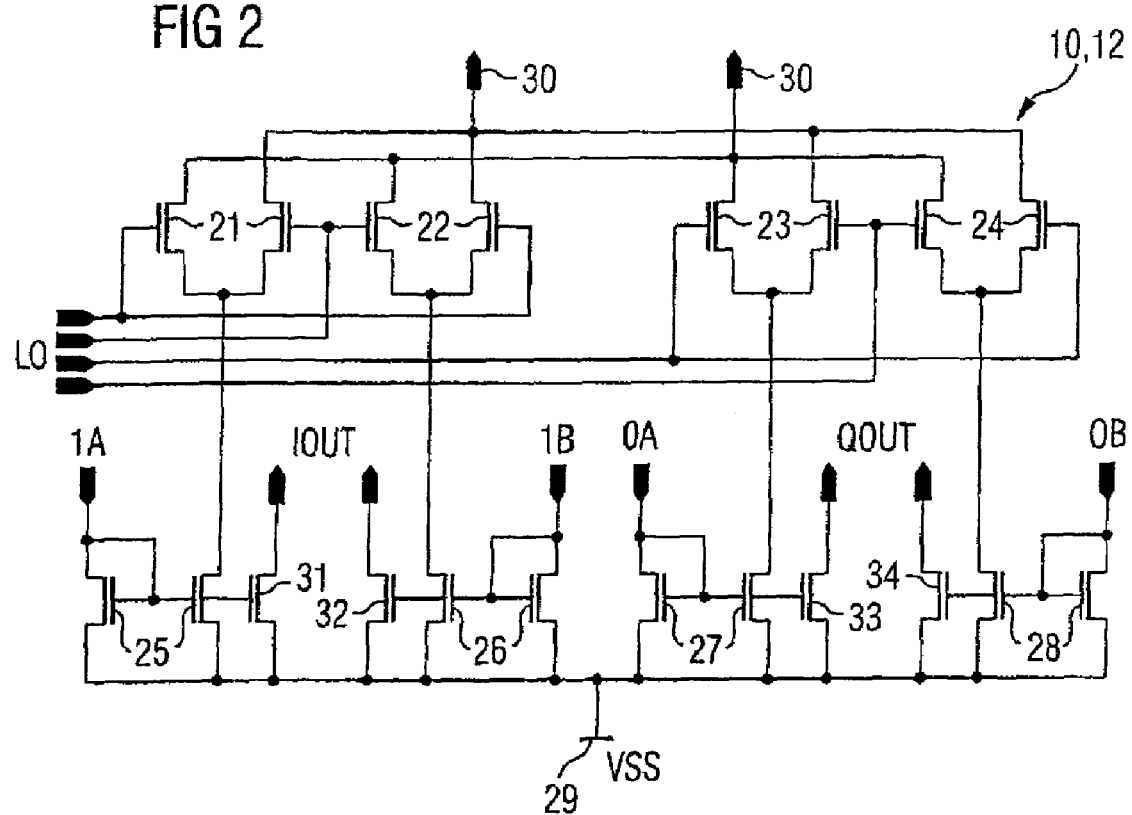

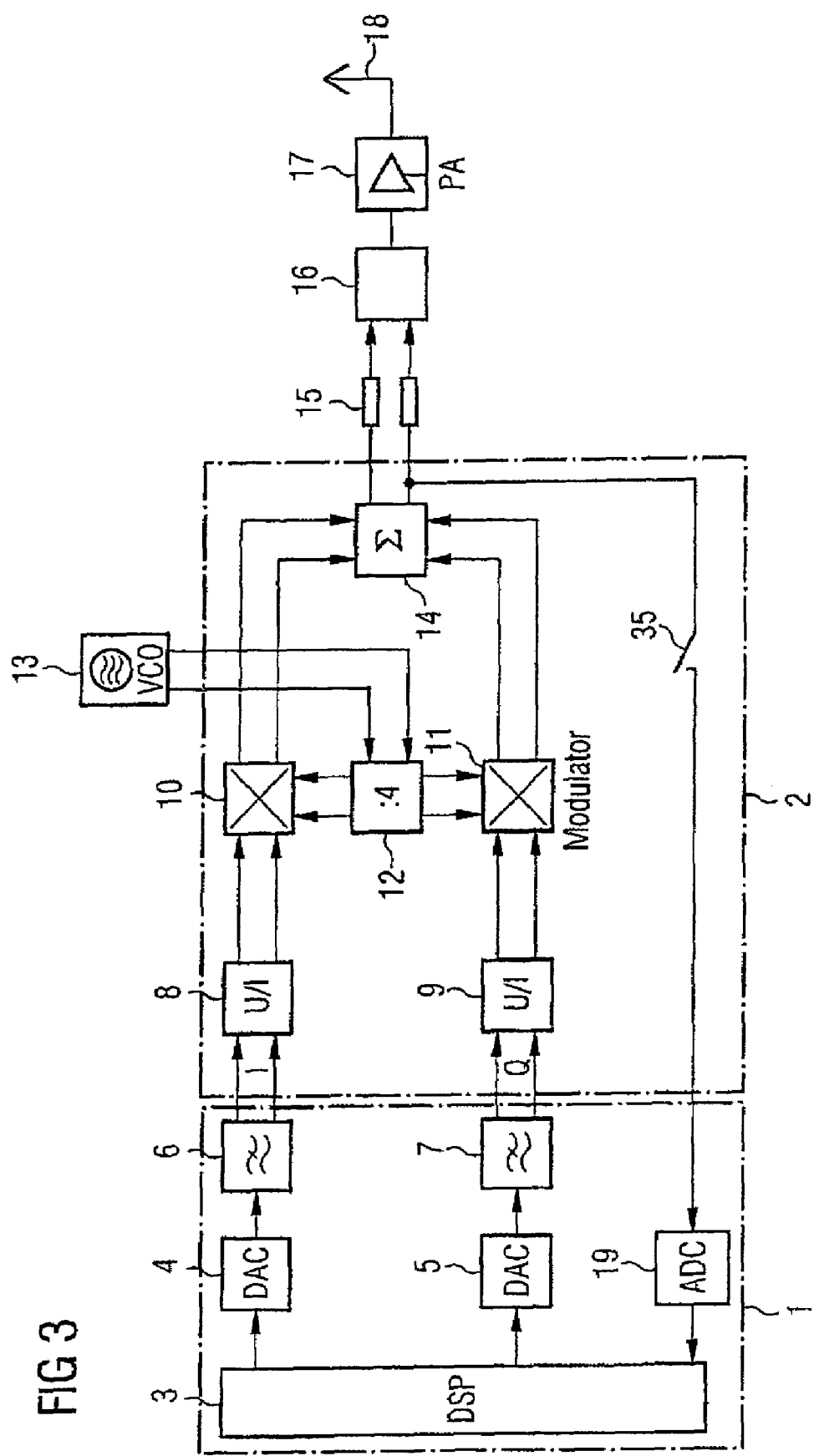

TRANSMISSION ARRANGEMENT, PARTICULARLY FOR MOBILE RADIO

REFERENCE TO RELATED APPLICATIONS

This application is a continuation of PCT/DE03/02477, filed 7/23/2003, which was not published in English, which claims the benefit of the priority date of German Patent Application No. DE 102 34 657.7, filed on Jul. 29, 2002, the contents of which both are herein incorporated by reference in their entireties.

FIELD OF THE INVENTION

The present invention relates to a transmission arrangement, particularly for mobile radio.

BACKGROUND OF THE INVENTION

In mobile radio, the use of heterodyne transmission architectures is increasingly being replaced by the use of homodyne architectures with direct conversion from baseband to a radio frequency.

If the baseband signal is in the form of a complex-value signal which has been split into an inphase component and a quadrature component which is orthogonal thereto, then a quadrature modulator or vector modulator is normally provided for converting the frequency of the modulation signal to a carrier frequency. A vector modulator normally comprises two Gilbert mixer cells. These up-convert the useful signal to a carrier frequency. In this case, a carrier signal generated by a frequency generator is supplied to one of the two radio-frequency mixers or multipliers in unaltered form and to the other with a phase shift of 90°. A summing element connected downstream of the two mixers combines the output signals with one another to form a transmission signal.

With a modulator of this kind, it is desirable to obtain sufficient carrier suppression and sideband suppression.

However, the carrier suppression is normally impaired by offset voltages, which may arise as a result of unavoidable component mismatches during mass production, for example. In addition, inadequate insulation between the carrier signal input and the signal output of the modulator may result in crosstalk by the carrier signal and hence in further impairment of the carrier suppression.

The ever greater bandwidth requirement, the increasing data rates, the demands for ever lower drawn current and the introduction of new modulation methods are continually increasing the demands on carrier suppression in a modulator. Taking the mobile radio standard GSM (Global System for Mobile communication) as a basis, the modulation method 8-PSK (Phase Shift Keying) provided in line with the GSM EDGE system increases the linearity demands and the demands on carrier suppression.

Inadequate sideband suppression may normally arise firstly from a discrepancy in the ideal phase difference of 90° for the carrier signals for the vector modulator. Secondly, any existing amplitude mismatch in the useful signal components may also result in impairment of the sideband suppression.

The document U.S. Pat. No. 4,243,955 specifies a method for improved carrier suppression in modulation systems. In this case, in addition to the actual carrier signal a quadrature signal is generated and is added to the modulated radio-frequency signal at the output of a modulator. Any carrier signal which shows through is suppressed on account of the opposing phases.

A further method for avoiding carrier crosstalk is specified in the document U.S. Pat. No. 5,574,994. In this document, a modulated, radio-frequency transmission signal is attenuated on the basis of the power gain in a feedback path, is down-converted to baseband, is amplified and is added to the inphase and quadrature paths in baseband as appropriate.

In addition, trimming methods during manufacture are also known, which involve spectrum analyzers being used to improve the carrier and sideband suppression by trimming the baseband signals. Furthermore, the offset voltages in the modulator circuits can be reduced by virtue of appropriate enlargement of the surface areas of the components used and by virtue of layout measures during circuit design.

It is also a known practice to measure, with a Schottky diode as a power detector, the radio-frequency modulation signal following amplification with a power amplifier. The resultant analog signal is then converted into a digital signal to ascertain the carrier suppression for trimming the baseband signals with a digital signal processor by means of computation.

The methods described have the common drawback that a relatively high level of circuit complexity is required in order to implement said methods in integrated circuits.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a transmission arrangement, particularly for mobile radio, which allows the carrier and sideband suppression to be improved with little complexity.

The transmission arrangement of the present invention comprises a baseband signal processing unit that is operable to condition a useful signal comprising an inphase and a quadrature path or component with a respective digital/analog converter. The arrangement also includes a frequency converter with an inphase input, which is coupled to the inphase path of the baseband signal processing unit, and with a quadrature input, which is coupled to the quadrature path of the baseband signal processing unit. The frequency converter also has an output for providing a modulated signal which has been derived from the useful signal. The arrangement further comprises a feedback path comprising an analog/digital converter with an input connected to the inphase input and to the quadrature input of the frequency converter via a respective switch. The analog/digital converter further includes an output connected to a control input of the baseband signal processing unit and such output influences the inphase component or the quadrature component of the useful signal.

For the carrier trimming which is required for carrier suppression, the present invention involves the offset voltages and the currents in the inphase and quadrature paths at the input of the up-conversion frequency changer or converter or the signal at the output of the up-conversion frequency changer or converter being respectively detected with an analog/digital converter.

The offset voltages in the modulator can be trimmed by virtue of the digital baseband signal processing involving a digital offset being added to the amplitude of the inphase signal component in baseband or to the quadrature component of the useful signal in baseband. In this case, trimming the modulator's offset voltage brings about the desired carrier suppression.

The magnitude of the sideband suppression is increased by virtue of a respective voltage of the same amplitude being applied in the inphase path and in the quadrature path in a calibration mode in baseband. Again, the A/D converter in the feedback path is used to detect an amplitude mismatch between the inphase and quadrature paths at the mixer input or at the output of the mixer. The trimming is effected on the basis of the measured signals by altering the amplitude, that is to say the gain in the inphase path or in the quadrature path of the baseband signal processing unit.

Preferably, the ascertained values may be stored for the useful signal transmission mode with modulated baseband.

The trimming may be effected either before a radio-frequency signal is transmitted or during the transmission mode. If the trimming is to take place during the transmission mode, then the feedback path is connected to the inphase and quadrature inputs of the frequency converter.

Since the offset voltages have thus been reduced but are simultaneously dependent on the size of the components used, the present invention advantageously allows smaller components, particularly transistors and resistors, to be used. The relatively high carrier suppression which is required for GSM EDGE and UMTS (Universal Mobile Telecommunications Standard) can be attained by means of the modulator trimming which is possible with the present invention. In this case, it is advantageously possible to dispense with radio-frequency detectors such as Schottky diodes, directional couplers etc. In addition, there is advantageously no need for complex manual trimming of the mobile radio transmitter during production.

The measured signal being fed back is preferably measured at the inphase and quadrature inputs of the frequency converter, which is preferably in the form of a vector modulator, at the inputs of the multiplier cells in question. To this end, the feedback path containing the A/D converter is preferably connected to the useful signal inputs of the two mixer cells in the modulator.

Preferably, feedback and A/D conversion are effected by tapping off a signal which is proportional to the respective signal component to be detected at the input of the radio-frequency mixer.

With further preference, a current input for supplying a current corresponding to the respective useful signal component has a portion of these currents tapped off and measured with the A/D converter.

The currents are preferably tapped off in a respective current mirror for feeding the mixer cells with the IQ signal components, a further preference being that the output transistor in the current mirror is produced in duplicate and the supplementary transistor has an output connection which is coupled to the A/D converter. As explained, switches are preferably provided for the coupling.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained below using exemplary embodiments with reference to a plurality of drawings, in which:

FIG. 2 is a schematic diagram illustrating an exemplary circuit of the vector modulator of FIG. 1 with currents preferably tapped off at the mixer inputs, and FIG. 3 is a block diagram illustrating an exemplary, alternative embodiment of the transmission arrangement from FIG. 1 according to the present invention.

DETAILED DESCRIPTION OF THE INVENTION

Figure 1:
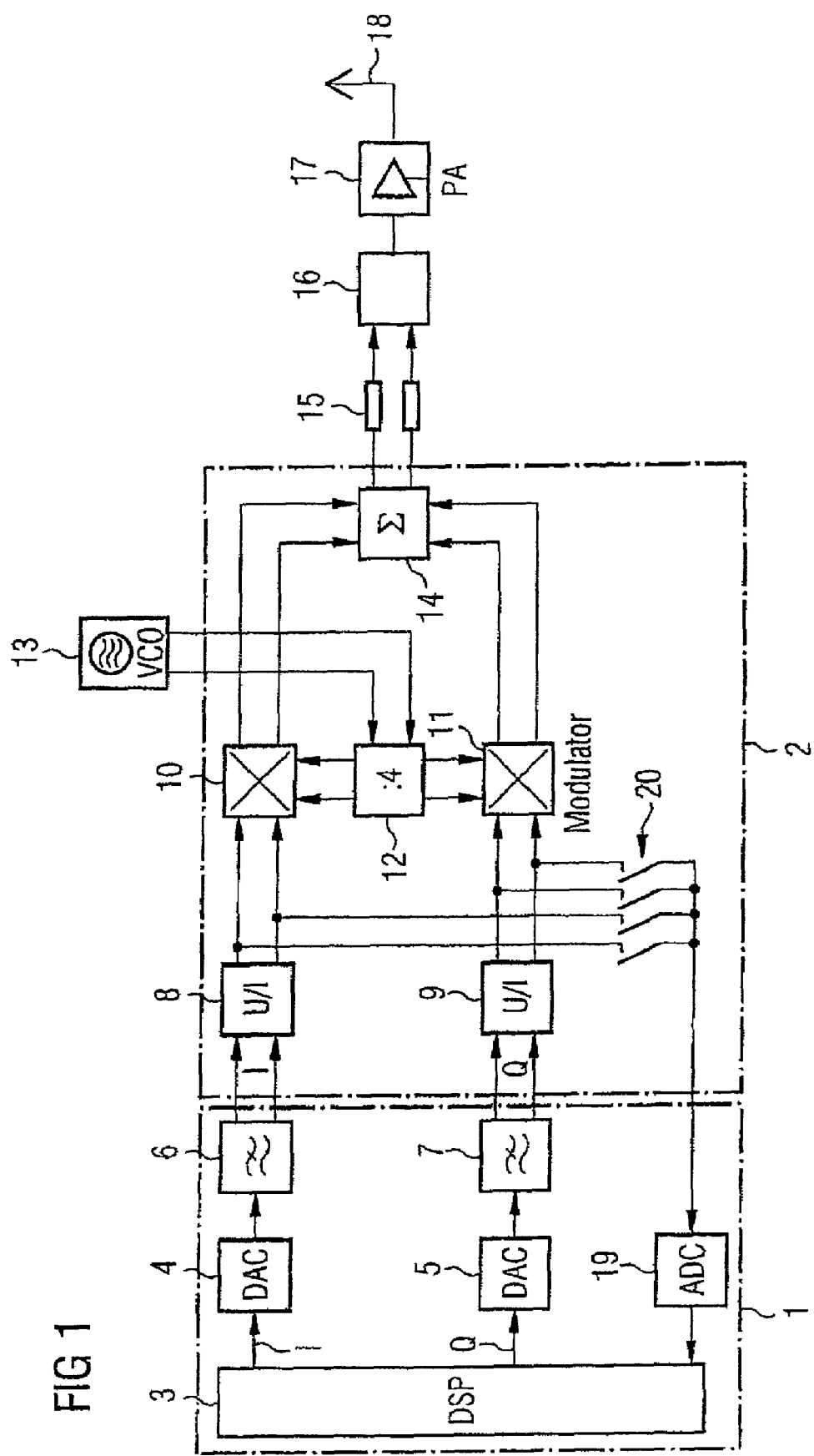
FIG. 1 is a block diagram illustrating an exemplary embodiment of the present invention with reference to a transmission arrangement.

FIG. 1 shows a mobile radio transmitter with a homodyne architecture in line with the present principle. It comprises a baseband block 1 and a radio-frequency block 2.

The baseband block 1 contains a digital baseband signal processing unit 3 with an inphase output and a quadrature output to which an inphase signal path I and a quadrature signal path Q are connected for the purpose of transmitting complex-value signal components of the useful signal. The baseband signal processing unit 3 is in the form of a digital signal processor. The two outputs respectively have digital/analog converters 4, 5 connected to them in the I and Q paths, the output sides of said converters having a respective low-pass filter 6, 7 connected downstream of them. The outputs of the low-pass filters 6, 7 are of balanced design for the purpose of carrying differential signals and form inphase and quadrature outputs of the baseband block 1.

These outputs of the baseband block have voltage/current converters 8, 9 connected to them both in the inphase and in the quadrature signal path I, Q, said voltage/current converters being arranged in the radio-frequency block 2. The outputs of these voltage/current converters are connected to the first inputs of a respective radio-frequency mixer 10, 11 in a vector modulator 10, 11, 12, 14. Second inputs on the radio-frequency mixers 10, 11, which are of balanced design, like the first inputs of the mixers 10, 11, are connected via a frequency divider 12 to a voltage-controlled oscillator 13 which operates as a carrier frequency generator. The outputs of the mixer cells 10, 11 are connected to inputs on a summing element 14, whose balanced output forms the output of the radio-frequency block 2.

Coupling elements 15, a downstream balanced/unbalanced converter 16 which converts the balanced signal into an unbalanced signal and a power output stage 17 are used to couple an antenna 18 to the output of the vector modulator and hence to the output of the summing element 14. The vector modulator accordingly comprises the frequency divider 12, the two frequency mixers 10, 11 and the summing element 14.

In addition, the present invention provides a feedback path which comprises an analog/digital converter 19. The input of the A/D converter 19 is connected via a total of four switches 20 to respective associated balanced first signal inputs on the two mixers 10, 11. Hence, a total of four signals, in the present case current signals, are tapped off and are converted into a digital signal using the A/D converter. This signal, which may comprise a plurality of or partly combined single signals, is supplied to the digital signal processor 3 in order to influence the inphase or quadrature path so as to correct the offsets. Alternatively or in addition, instead of offsets in the inphase or quadrature signal, it is also possible to adjust the amplitudes in the inphase or quadrature path, so that in addition to or alternatively to carrier suppression an improved sideband suppression effect is attained with the tapped-off and digitized current data.

In line with FIG. 1, any offset which is present in the audio-frequency linear baseband signal is measured and trimmed directly in the vector modulator 10, 11, 12, 14 right at the input to the combination of the baseband signal using the quadrature transistors in the mixers. The breakthrough of the carrier signal, which arises as a result of offsets in the baseband signal, and the unwanted modulator sideband, which arises as a result of amplitude mismatches between the inphase and quadrature paths, can be significantly reduced in this manner. The circuit complexity required for this is particularly low in this case.

FIG. 2 shows the radio-frequency mixers 10, 11 (designed for balanced signal processing) from FIG. 1, including summing element 14, using an exemplary circuit diagram. In this case, the balanced or differential signal processing means that the modulator contains a total of four mixer cells 21, 22, 23, 24 (constructed using MOS circuitry) which each comprise two n-channel MOS field-effect transistors whose sources are connected directly to one another in pairs. A carrier signal or local oscillator signal LO which has been split into inphase and quadrature components and is respectively supplied as a differential signal is supplied to these field-effect transistors at the interconnected gate connections on a total of four input terminals, as is customary in quadrature modulators. For this, the four input terminals have the four-way frequency divider 12 (not shown in FIG. 2) from FIG. 1 connected to them.

The eight drain connections of the mixer cells 21, 22, 23, 24 are combined with one another in signal-summing fashion to form the balanced output 30, as is customary for vector modulators.

The useful signal (again in the form of inphase and quadrature components in differential form), which is already in the form of a current signal, is supplied at the source nodes (which are likewise coupled to one another) of the four mixer cells 21, 22, 23, 24 on input terminals, of which there are likewise four, via a respective current mirror 25, 26, 27, 28 whose output transistor is connected to the respective common source node of the associated mixer cell. The current mirrors 25 to 28 comprise a respective n-channel field-effect transistor, which is connected up as a diode and operates as an input transistor, and a respective output transistor, whose gate connection is connected to the gate connection of the associated transistor connected up as a diode. The sources of the input and output transistors in the current mirrors are connected directly to a reference potential connection 29.

A particular feature of the present vector modulator is that the respective gate connection of a supplementary transistor 31, 32, 33, 34 which is used for tapping off and feeding back current is connected to the gate connections of the output transistors in the current mirrors 25 to 28. The supplementary transistors, like the current-mirror transistors, are in the form of n-channel field-effect transistors and have their sources connected directly to reference potential connection 29.

The drain connections of the supplementary transistors 31, 32, 33, 34 form the current-tapping connections of the modulator, which are connected to the feedback path in FIG. 1 via switches 20 at A/D converter 19. The transistors 31, 32 form the balanced inphase output IOUT and the transistors 33, 34 form the likewise balanced quadrature output QOUT of the vector modulator at the inputs of the multipliers.

The differential baseband signals which are split into complex-value components are supplied via the current mirrors 25 to 28 to the quadrature mixer transistors 21 to 24, where they are mixed with the local oscillator signal. The parallel output transistors 31 to 34 are used to tap off a portion of the baseband currents, and the voltage drop across a respective resistor (not shown here) is measured with an A/D converter. During layout development, these transistors 31 to 34 preferably form a unit with the output transistors in the current mirrors 25 to 28 in order to ensure a narrow pairing tolerance for the transistors.

It can clearly be seen that the signals can be tapped off without complex additional components such as Schottky diodes and directional couplers. Advantageously, the invention can therefore be implemented with little complexity and is particularly suitable for mass production of mobile radios.

FIG. 3 shows an alternative embodiment of the transmission arrangement from FIG. 1. This largely matches the block diagram from FIG. 1 in terms of design and action, and the description thereof will therefore not be repeated in this respect at this juncture. The only difference is the connection of the feedback path containing the analog/digital converter 19, which, in line with FIG. 3, is not connected to the inputs of the mixer cells 10, 11 via four switches 20 but rather to an output on the vector modulator 10, 11, 12, 14, more precisely on the combination element 14 at the output of the vector modulator. The feedback path is connected at this point and is routed via a switch 35 and via the A/D converter 19 to the digital baseband signal processing unit 3.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A transmission arrangement for a mobile radio, comprising:
   a baseband signal processing unit configured to condition a useful signal comprising an inphase component and a quadrature component with a respective digital/analog converter, and provide such conditioned useful signal components at an inphase path output and a quadrature path output, respectively;
   a frequency converter comprising an inphase input coupled to the inphase path output, and a quadrature input coupled to the quadrature path output of the baseband signal processing unit, and further comprising an output, and configured to provide a modulated signal derived from the useful signal at the frequency converter output; and
   a feedback path comprising an analog/digital converter comprising an input connected to the inphase input and to the quadrature input of the frequency converter via a respective switch, and comprising an output connected to a control input of the baseband signal processing unit, wherein the baseband signal processing unit is configured to alter one of the inphase component and the quadrature component of the useful signal in response to a signal at the control input.

2. The transmission arrangement of claim 1, wherein the frequency converter comprises a quadrature modulator, the quadrature modulator comprising:
- a first radio-frequency mixer comprising a first input connected to the inphase path output, and a second input configured to receive a carrier signal, and configured to up-convert the inphase component to a frequency associated with the carrier signal;
- a second radio-frequency mixer comprising a first input connected to the quadrature path output, and a second input configured to receive the carrier signal, and configured to up-convert the quadrature component to the frequency associated with the carrier signal; and
- a summing element comprising inputs connected to outputs of the first and second radio-frequency mixers, respectively, and configured to combine the outputs of the first and second radio-frequency mixers and provide such combination at an output that forms the output of the frequency converter, wherein the input of the analog/digital converter in the feedback path is connected to the first inputs of the first and second radio-frequency mixers via a respective switch.

3. The transmission arrangement of claim 2, wherein the first radio-frequency mixer and the second radio-frequency mixer each comprise, at their first inputs, a means for tapping off a signal which is proportional to the inphase component and the quadrature component, respectively.

4. The transmission arrangement of claim 3, wherein each of the first and second radio-frequency mixers further comprise:
- a controlled current source coupled to the respective first input, and configured to supply current as a function of the inphase component and the quadrature component, respectively;
- a mixer cell coupled to the controlled current source and configured to mix the inphase component and the quadrature component with the carrier signal, respectively; and
- a supplemental current source coupled to the controlled current source, and configured to generate a signal that is proportional to the inphase component and the quadrature component, respectively, and provide the signal at the feedback path.

5. The transmission arrangement of claim 4:
wherein the controlled current sources each comprise transistors in a respective current mirror, the current mirrors each comprising a transistor and a diode-connected transistor connected thereto, and configured to actuate the transistor, and
wherein the supplementary current sources each comprise a transistor having a control input connected to the diode-connected transistor.

6. The transmission arrangement of claim 1, further comprising two voltage/current converters respectively connected between the outputs of the respective digital/analog converters in the baseband signal processing unit and the first inputs of the first and second radio-frequency mixers.

* * * * *